United States Patent
Schoenfeld

(10) Patent No.: US 6,617,692 B2
(45) Date of Patent: *Sep. 9, 2003

(54) APPARATUS FOR IMPLEMENTING SELECTED FUNCTIONALITY ON AN INTEGRATED CIRCUIT DEVICE

(75) Inventor: Aaron Schoenfeld, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/846,005

(22) Filed: Apr. 30, 2001

(65) Prior Publication Data

US 2001/0026022 A1 Oct. 4, 2001

Related U.S. Application Data

(62) Division of application No. 09/012,113, filed on Jan. 22, 1998, now Pat. No. 6,351,040.

(51) Int. Cl.⁷ ................................................ H01L 23/48
(52) U.S. Cl. ..................... 257/776; 257/923; 257/786; 361/772
(58) Field of Search ............................... 257/923, 920, 257/691, 786, 784, 776; 361/813, 772; 438/617

(56) References Cited

U.S. PATENT DOCUMENTS

| 4,213,141 A | 7/1980 | Colussi |
| 4,403,240 A | 9/1983 | Seki et al. |
| 5,043,943 A | 8/1991 | Crisp et al. |
| 5,170,312 A * | 12/1992 | Davies et al. ............... 361/100 |
| 5,303,180 A | 4/1994 | McAdams |
| 5,353,250 A | 10/1994 | McAdams |
| 5,354,955 A | 10/1994 | Gregor et al. |
| 5,399,904 A * | 3/1995 | Kozono ....................... 257/666 |
| 5,455,460 A * | 10/1995 | Hongo et al. ................ 257/734 |
| 5,473,196 A * | 12/1995 | De Givry .................... 257/786 |
| 5,598,967 A | 2/1997 | Greenwood et al. |
| 5,612,575 A | 3/1997 | De Givry et al. |
| 5,682,105 A | 10/1997 | Fujima et al. |
| 5,763,298 A * | 6/1998 | Parris et al. ................. 438/128 |
| 5,838,072 A * | 11/1998 | Li et al. ...................... 257/786 |
| 5,880,596 A | 3/1999 | White |
| 5,989,939 A | 11/1999 | Fjelstad |
| 6,097,098 A | 8/2000 | Ball |
| 6,194,774 B1 | 2/2001 | Cheon |
| 6,348,400 B1 | 2/2002 | Schoenfeld |
| 6,351,040 B1 * | 2/2002 | Schoenfeld ................. 257/784 |

* cited by examiner

Primary Examiner—Kamand Cuneo
Assistant Examiner—Lourdes Cruz
(74) Attorney, Agent, or Firm—TraskBritt

(57) ABSTRACT

A semiconductor device in a computer system is disclosed that includes a die having an active surface bearing integrated circuitry, the die including a plurality of bond pads thereon connected to the integrated circuitry. At least one electrically conductive wire bond is made between first and second bond pads of the plurality of bond pads for providing external electrical connection between the two bond pads, which are not interconnected via the integrated circuitry within the die. The first bond pad can be a lead finger on the active surface and the second bond pad can be an option bond pad electrically connected to a third bond pad selected from the plurality of bond pads on the active surface via the integrated circuitry. Further, the third bond pad can connect to a fourth bond pad selected from the plurality of bond pads via a wire bond. The first bond pad can also be an internal voltage line and the second bond pad an external voltage line or the bond pads can be different internal buses within the integrated circuitry.

12 Claims, 7 Drawing Sheets

APPARATUS FOR IMPLEMENTING SELECTED FUNCTIONALITY ON AN INTEGRATED CIRCUIT DEVICE

CROSS REFERENCE TO RELATED APPLICATION

This application is a divisional of application Ser. No. 09/012,113, filed Jan. 22, 1998, now U.S. Pat. No. 6,351,040, issued Feb. 26, 2002.

BACKGROUND OF THE INVENTION

1. Field of the Invention

This invention relates generally to providing die interconnection within a semiconductor die and, more specifically, to a method and apparatus for routing die interconnections for accessing selected functional segments located on an integrated circuit semiconductor die.

2. State of the Art

A typical integrated circuit (IC) or semiconductor die includes external connection points termed "bond pads" that are in electrical communication with integrated circuits formed on the active surface of the semiconductor die. The bond pads are used to provide electrical connection between the integrated circuits and external devices, such as a lead frame or a printed circuit board. The bond pads also provide sites for electrical testing of the die, typically by contact with probes, which send and receive signals to and from the die to evaluate the functionality of the die.

In a conventional semiconductor die and lead frame assembly, the semiconductor die is attached to a die paddle of a lead frame using an adhesively coated tape or an adhesive, in some instances. The bond pads formed on the active surface (face) of the die are typically electrically and mechanically attached to lead fingers of a lead frame either terminating adjacent the periphery of the semiconductor die, if it is a conventional lead frame, or adjacent the center of the semiconductor die, if it is a lead-over-chip type lead frame, using bonding wires of gold, aluminum or other metals or alloys thereof.

Wire bonding is typically a process through which some or all of the bond pads formed on the active surface of the die are connected to the lead fingers or buses of a lead frame by metal bonding wires. The bonding wires comprise the electrical bridge between the bond pads and the leads of the packaged integrated circuit. A wire bonding apparatus bonds the bonding wires to the bond pads and to the lead fingers of the lead frame, typically using heat and pressure, as well as ultrasonic vibrations in some instances. Following wire bonding, the lead frame and die are typically encapsulated in a suitable plastic (particle-filled polymer) or, in some instances, packaged in a preformed ceramic or metal package. After encapsulation, the lead fingers of the lead frame are trimmed and configured to form the desired external leads of a completed semiconductor package in what is termed a "trim and form" operation.

It is often desirable to interconnect various bond pads on a single semiconductor die in order to alter the input or output functionality, or both, of the semiconductor die, such as when it is necessary to "wire around" defective portions of a semiconductor die that are only partially functional. For example, a 16 megabit DRAM memory die may only demonstrate 11 megabits of functional memory under electrical testing and burn in. Alternatively, it may be desirable for a semiconductor die having a given input/output (I/O) bond pad configuration to "look" to a particular lead frame or carrier substrate as if it were configured differently so that the semiconductor die could be used with a lead frame for which it was not originally intended. Such "wire around" functions, where possible, are typically accomplished by interconnecting bond pads on the semiconductor die through external circuitry in printed circuit boards or other carrier substrate to which the semiconductor die is mounted. Where the desired input or output, or both, functionality configuration varies from one semiconductor die to another, a separately configured printed circuit board or other carrier substrate must be provided for each desired input or output, or both, functional configuration. Thus, it would be desirable to provide a relatively easy way of interconnecting selected bond pads on a single integrated circuit semiconductor die without requiring the use of external circuitry imprinted circuit boards and other carrier substrates.

One solution has been to add electrically isolated intermediate connection elements or wire bondable jumper pads attached to the active surface of the die. These bondable jumper pads are electrically isolated from the external circuitry and from the circuitry of the semiconductor die, but for wire bonds extending to or from, or both, the bondable jumper pad. More specifically, each bondable jumper pad is not directly electrically connected to the internal circuitry of the semiconductor die, unlike the bond pad, but provides a "stepping stone" for wire bonds between bond pads of the semiconductor die or between a bond pad and a conductor external to the semiconductor die. Thus, a relatively short wire bond can be formed from a bond pad to the jumper pad and another relatively short wire bond from the jumper pad to another bond pad (or external conductor) forming an electrical connection between the bond pads (or bond pad and external conductor).

In another solution, a plurality of jumper pads is provided over the active surface of the semiconductor die, thus providing various serial jump points for a plurality of wire bonds to be formed in series between a plurality of bond pads. Where the semiconductor die has bond pads located about a peripheral edge of the active surface, a grid or array of jumper pads may be provided proximate the center of the active surface and at least partially bounded by the periphery bond pads.

Although these bonding pads are provided as alternative interconnections to provide wire around defective portions, additional functionality is desired to be accessed with various options being implemented on an integrated circuit semiconductor die. In certain situations, it is desirable to modify various circuits on the integrated circuit semiconductor die in such a way as to achieve a particular result. For example, in FIG. 1, a circuit design 2 is depicted that includes a regulator 4. Regulator 4 can be optioned in for a 5 volt (V) application and, with the addition of a metal masking step, can be optioned out for a 3.3 V application. Regulator 4 is tied to the gate of a field effect transistor 6, which is utilized as a pass device, that is controlling an external $V_{CCX}$ power signal and an internally regulated $V_{CCR}$ power signal. With a metal masking step 9, or a fuse integrated into the integrated circuit, regulator 4 can be bypassed as is shown in FIG. 2. Through the use of a fuse option or the metal mask 9 option, the gate of transistor 6 is hard wired at node 8 to $V_{SS}$, and metal mask 9 is still used to short the source and drain of field effect transistor 6 in order to avoid a voltage drop of several hundred millivolts across the transistor 6.

In another situation, as shown in FIG. 3, there is an assembly limitation of the number of bonds that could be made to a single lead finger for a particular design lead frame. FIG. 3 shows a plurality of lead fingers 12 that is aligned on the perimeter of a particular semiconductor die 10. The lead fingers 12 are connected to a portion of the plurality of bonding pads 14, where multiple pads are bonded to particular lead fingers 12. For example, such as illustrated in FIG. 2 where a design would require multiple connections between $V_{CC}$ and $V_{SS}$ to be bonded multiple times, a limited number of pins are available. Thus, it would be desirable to interconnect selected bond pads 14 on a single integrated semiconductor die without requiring the use of external circuitry in printed circuit boards and other carrier substrates or extraneous masking steps dedicated solely for element interconnection apart from other masking steps.

BRIEF SUMMARY OF THE INVENTION

According to the present invention, a semiconductor device is disclosed that includes a die having an active surface bearing integrated circuitry, the die includes a plurality of bond pads thereon connected to the integrated circuitry. At least one electrically conductive wire bond is made between first and second bond pads of the plurality of bond pads for providing external electrical connection between the two bond pads, which are not interconnected via the integrated circuitry within the die. The first bond pad can be a lead finger on the active surface and the second bond pad can be an option bond pad electrically connected to a third bond pad selected from the plurality of bond pads on the active surface via the integrated circuitry. Further, the third bond pad can connect to a fourth bond pad selected from the plurality of bond pads via a wire bond. The first bond pad can also be an internal voltage line and the second bond pad is an external voltage line or the bond pads can be different internal buses within the integrated circuitry.

The semiconductor device can be fabricated in any type of processing or memory device desired. As a processing or memory device, the bonding structure can be utilized in a computer system having an input and output device, as well as a central processing unit. A method is also disclosed that selects the appropriate bond pads and then provides the external electrical connection.

DETAILED DESCRIPTION OF THE INVENTION

Figure 4A:
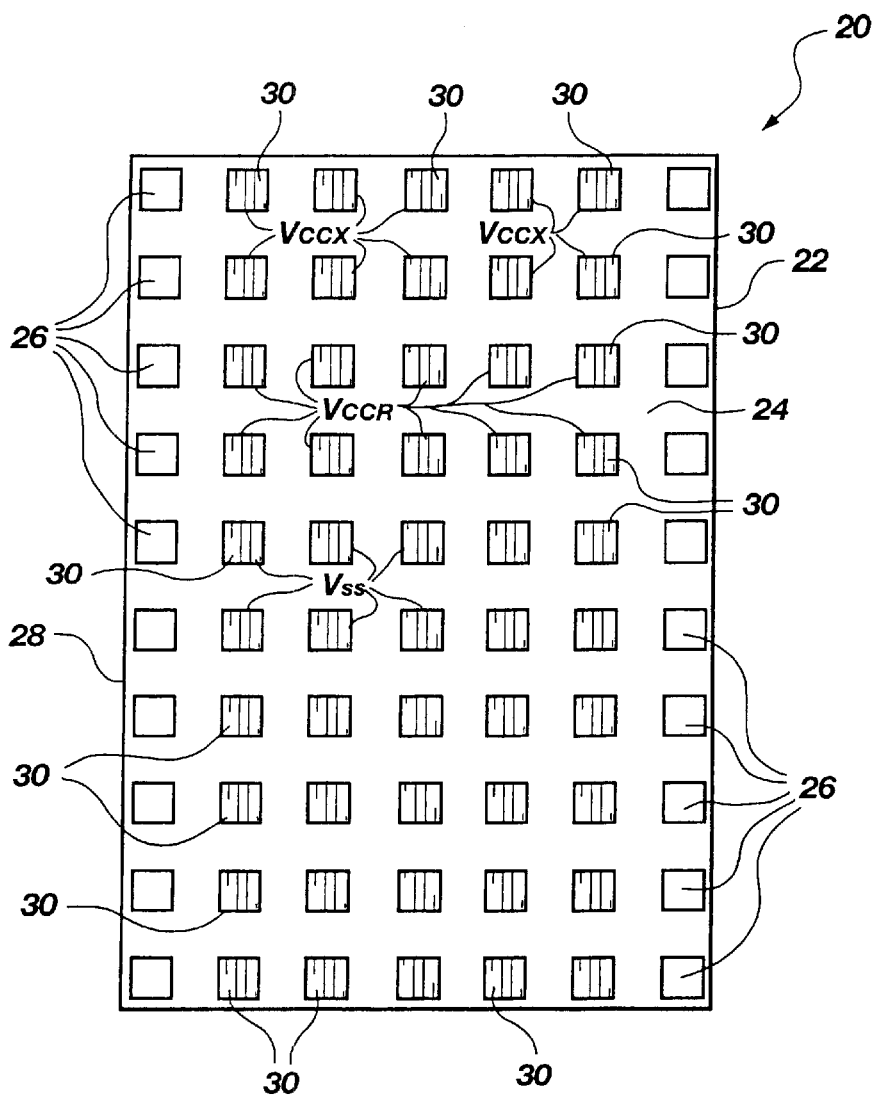
FIG. 4A illustrates in a top view the additional option pads according to the present invention.
Figure 4B:
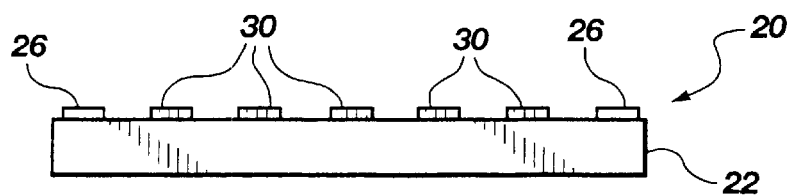
FIG. 4B illustrates in a side view the additional option pads according to the present invention.

A semiconductor device 20 is illustrated in FIGS. 4A and 4B. Semiconductor device 20 includes a semiconductor die 22 of generally rectangular configuration. The semiconductor die 22 has an active surface 24 carrying a plurality of bond pads 26 proximate its perimeter 28 and a plurality of functional option pads 30, distinguished by surface shading in the drawing and disposed between the rows of peripheral bonds pads 26. The bond pads 26 are formed as an integral part of die 22, making contact with and providing an external contact for internal circuitry (not shown) contained within the semiconductor die 22, as is known in the art.

Figure 1:
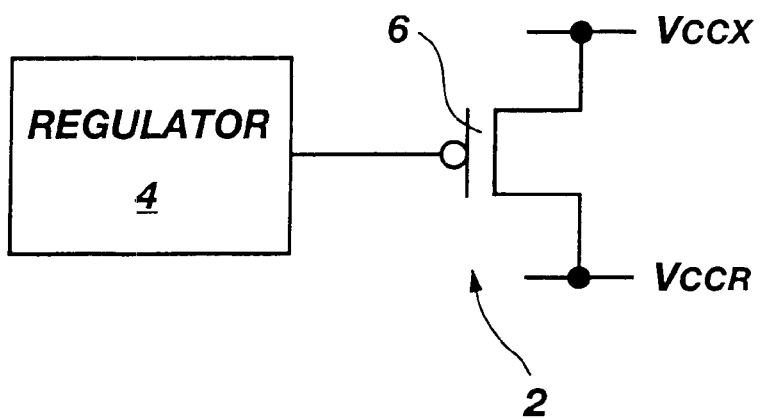
FIG. 1 is a prior art diagram of a voltage regulator having an external and internal connection.

These particular option pads 30 are manufactured during the same processing step as that for the bonding pads and are added to provide for selected functionality based upon the wiring step to be performed later. For example, as was shown in prior art FIG. 1, it is necessary at times to tie the $V_{CCX}$ power source with the internally regulated $V_{CCR}$ power line. Thus, in FIG. 4A, extra $V_{CC}$ pads 30 are provided that allow additional connection between the external $V_{CCX}$ and the internal $V_{CCR}$ contacts. Since option pads 30 are processed at the same time that peripheral bond pads 26 are added and processed, the subsequent masking step required in FIG. 1, or the fuse implementation, is eliminated, thus saving time and materials during processing.

Figure 5:
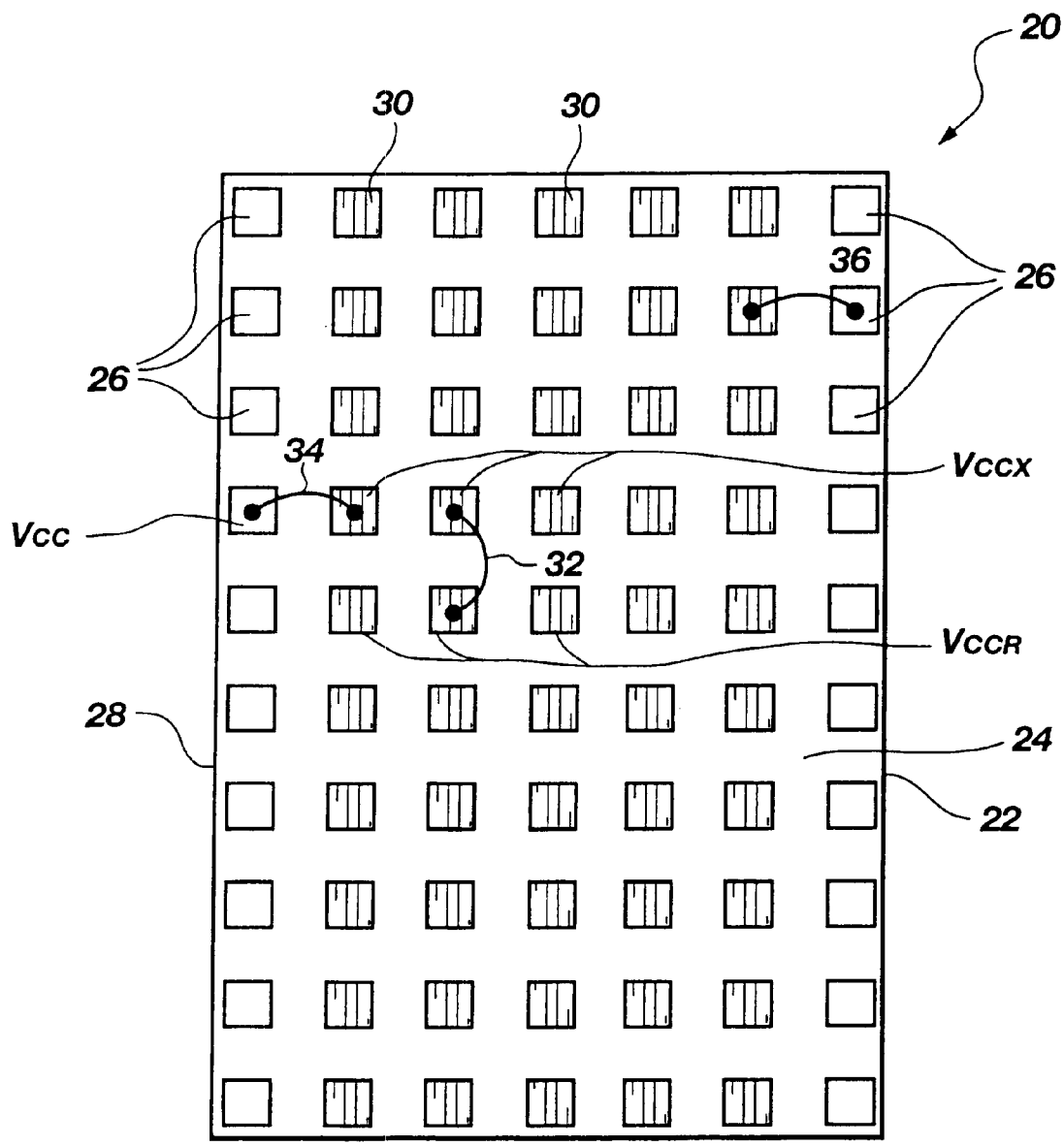
FIG. 5 depicts a wiring scheme using the bond pads of FIG. 4.

FIG. 5 illustrates how the wire bonds are formed between pads that are to be interconnected. As illustrated, wire bonds 32, 34, and 36 are connected between the various bond pads. In this example, wire bond 32 connects $V_{CCX}$ pad 30 with $V_{CCR}$ pad 30. Wire bond 34 connects $V_{CCX}$ pad 30 to $V_{CC}$ pad 26. Wire bond 36 connects another pad 26 to a different option pad 30. Other bonding schemes are possible according to the needs of the user. The termination points of wire bonds 32, 34, and 36 can be a ball, wedge or other configuration as is known in the art and formed with a conventional wire bonding machine. Accordingly, a large number of input/output (I/O) alternative configurations can be achieved for any semiconductor device, depending on the number and layout of jumper pads and the configuration of wire bonds. The wire bonds are typically formed of small diameter wire material, such as, for example, small diameter wire of gold, aluminum, silver or other known materials and alloys thereof used in the art.

Figure 2:
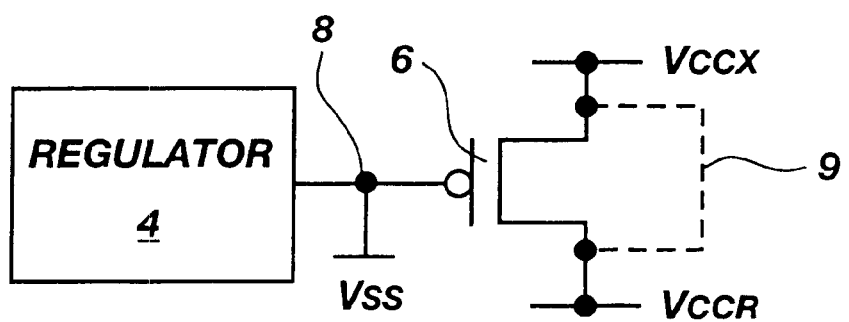
FIG. 2 is a prior art diagram of a process for shorting the external and internal connections of the regulator according to FIG. 1.
Figure 3:
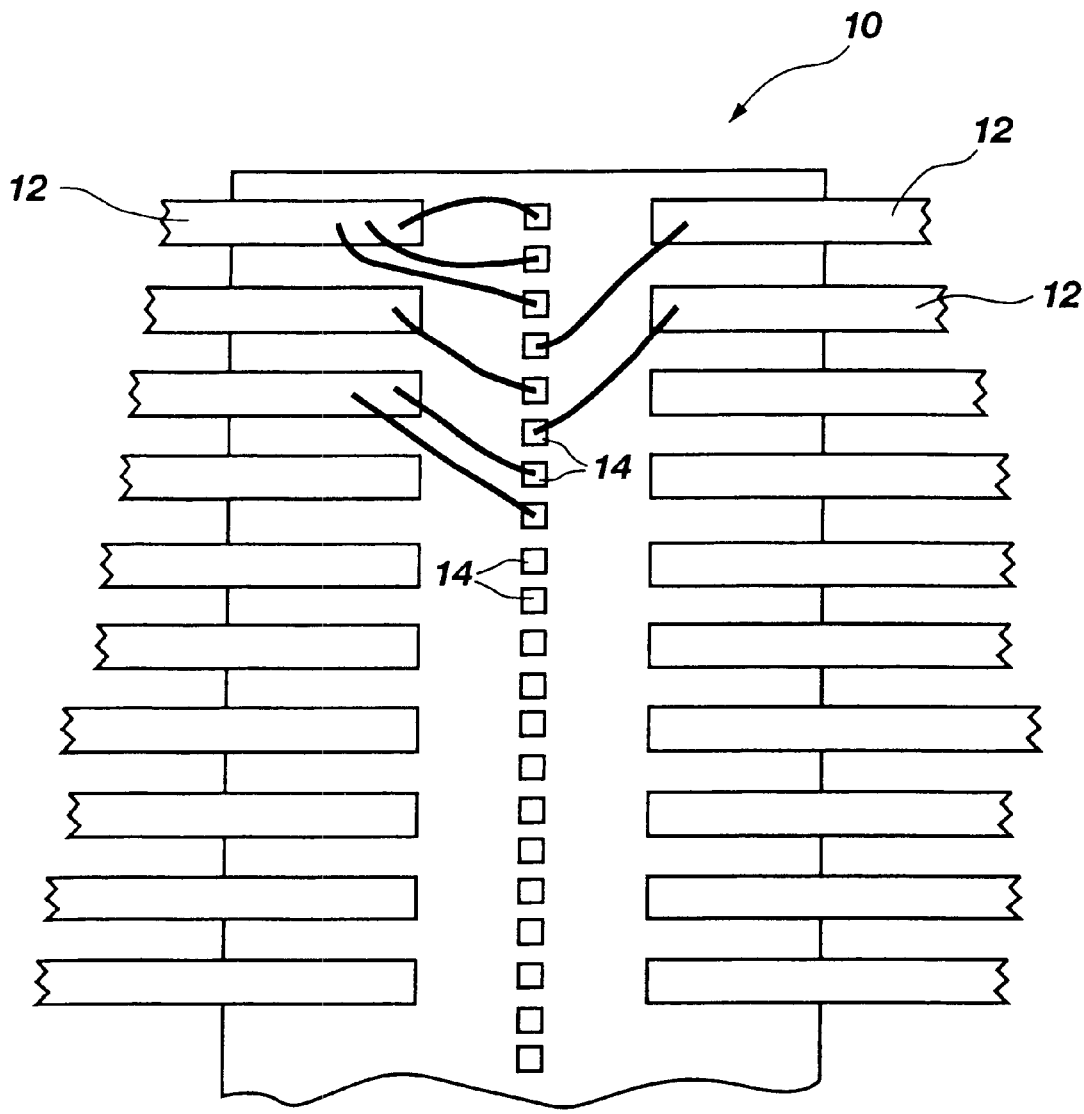
FIG. 3 is a prior art diagram of a plurality of bond pads used to connect to a given number of lead fingers of a lead frame having assembly limitation.
Figure 6A:
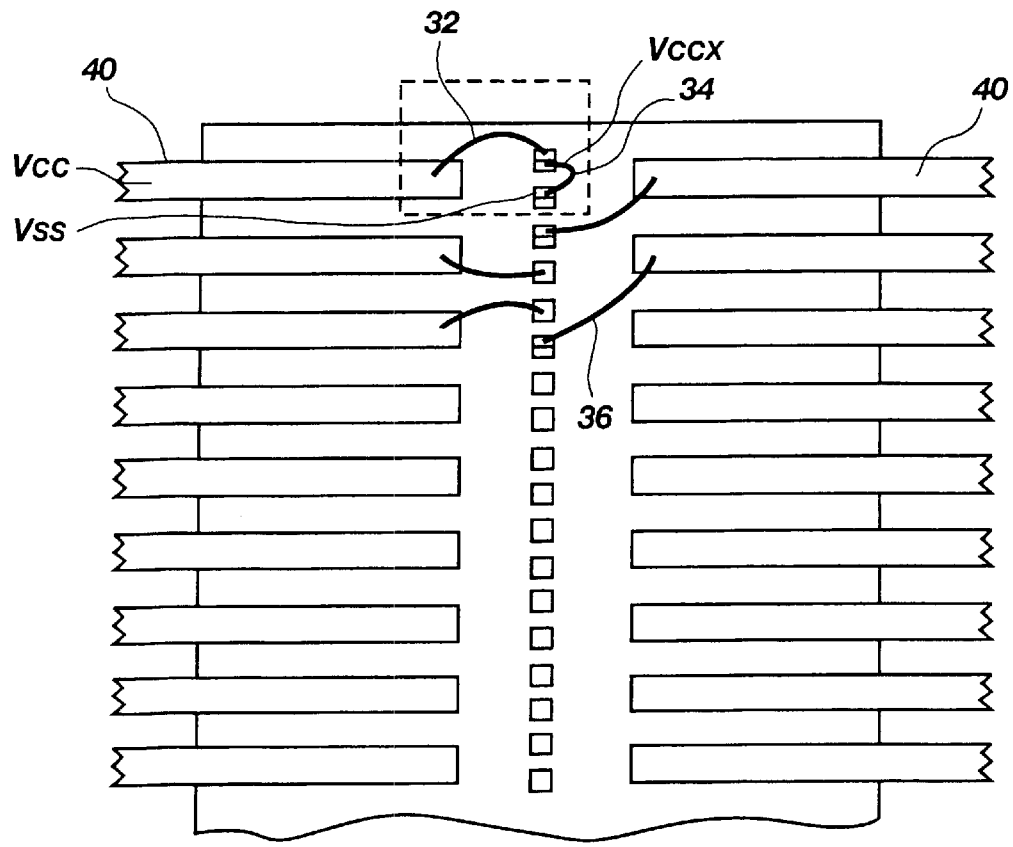
FIGS. 6A and 6B illustrate an alternative wiring scheme of the bond pads according to the present invention.

FIG. 6A depicts how multiple options pads 30 can be interconnected in such a fashion that a single wire bond or reduced number of wire bonds are made to outlying lead fingers 40 of a lead frame, which overcomes the interconnection problems described in the prior art with respect to FIG. 2. This is useful when there is an assembly limitation on the number of wire bonds that can be made to a single lead finger of a lead frame for a particular semiconductor die and lead frame design. Again, this is seen in designs that require the $V_{CC}$ and the $V_{SS}$ to be bonded multiple times, but the scope of the invention is not limited to those particular pins. The present invention may be used with any other bond pads of semiconductor dice that require multiple lead connections.

Figure 6B:
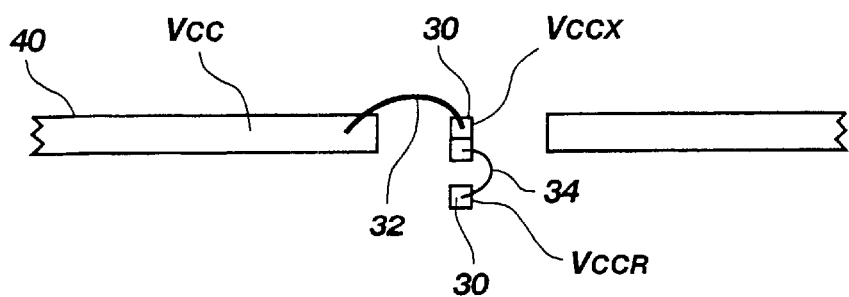

In FIG. 6A, and further shown in enlarged view in FIG. 6B, the $V_{CC}$ connection with lead finger 40 is made to several bond pads 30; for example, bond pads 30 may be $V_{CCR}$ and $V_{CCX}$, thus relaxing the assembly requirements. Additionally, an advantage in using multiple bond pads 30 is that if during the wire bonding process any shorts occur accidentally, such as shorts between wire bond 34 and wire bond 32, there is no harm as the wires being shorted together have the same potential.

The use of the multiple bonding pads reduces the cost of manufacturing in that an additional metal mask step has been eliminated. This occurs by providing the same function by merely shorting across the pass device. Additionally, throughput is increased during the fabrication operation. Specifically, this occurs because of limiting the run to only one metal mask during fabrication for such operations as when differing voltage potentials are designed. For example, if a 3.3 volt (V) design is preferred over a 5 V design, the actual implementation on the same die can be made during the bonding process rather than adding a separate metal mask and step to provide the desired functionality. This allows the designer to defer the decision of selecting functions until during the assembly portion of the die manufacturing process and to even defer the decision until probe or test, depending upon whether laser fuse or antifuse devices are used to tie the gate of the past device to the appropriate voltage. Also, in designs that require multiple $V_{CC}$ or $V_{SS}$ to be bonded and where there is an assembly limitation on the number of bonds possible, the additional bonding pads with wire interconnection overcome the limitation of the number of bonds by interconnecting the bonding pads before making one or a small number of actual bonds to a given lead finger.

Those skilled in the art will appreciate that semiconductor devices according to the present invention may comprise an integrated circuit die employed for storing or processing digital information, including, for example, a Dynamic Random Access Memory (DRAM) integrated circuit die, a Static Random Access Memory (SRAM) integrated circuit die, a Synchronous Graphics Random Access Memory (SGRAM) integrated circuit die, a Programmable Read-Only Memory (PROM) integrated circuit die, an Electrically Erasable PROM (EEPROM) integrated circuit die, a flash memory die and a microprocessor die, and that the present invention includes such devices within its scope. In addition, it will be understood that the shape, size, and configuration of bond pads, jumper pads, dice, and lead frames may be varied without departing from the scope of the invention and appended claims. For example, the jumper pads may be round, oblong, hemispherical or variously shaped and sized so long as the jumper pads provide enough surface area to accept attachment of one or more wire bonds thereto. In addition, the bond pads may be positioned at any location on the active surface of the die.

Figure 7:
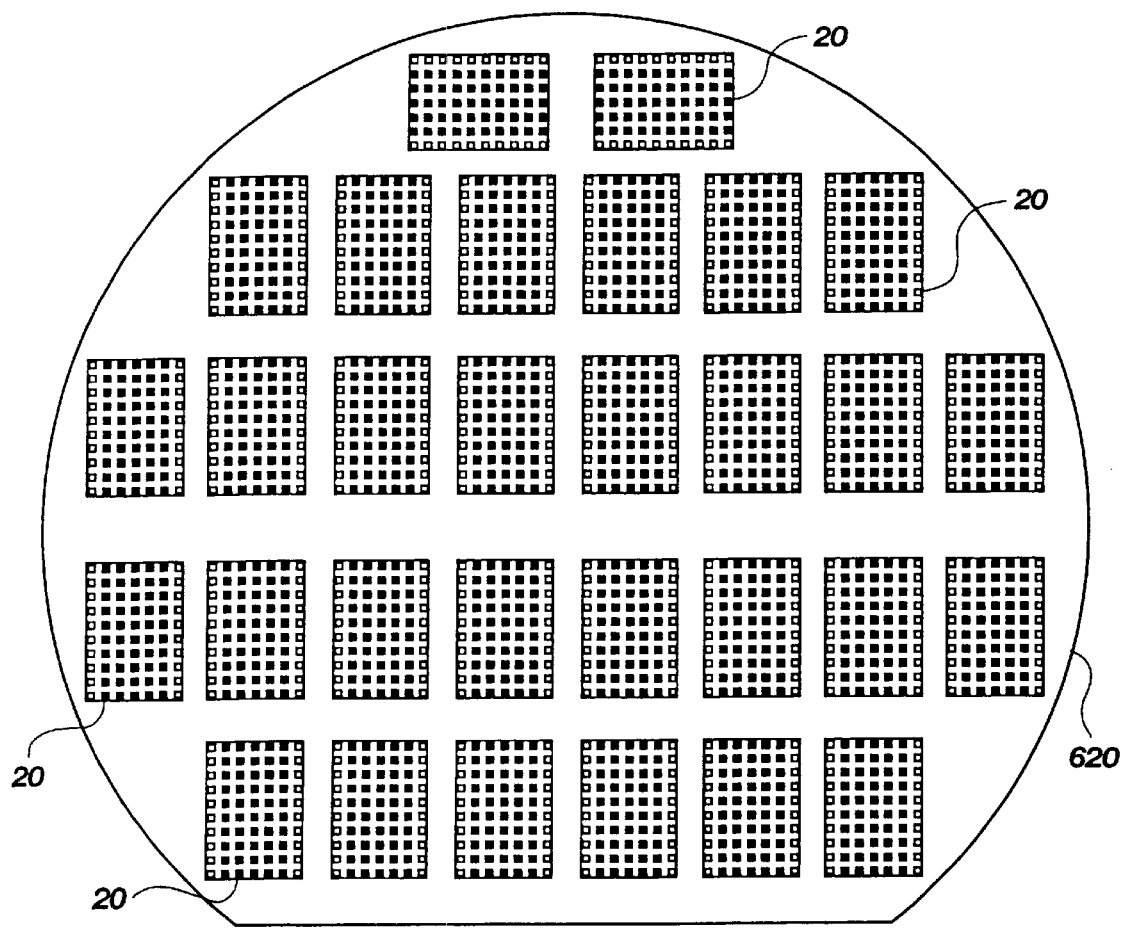
FIG. 7 is a top view of a semiconductor wafer comprising a plurality of the semiconductor device illustrated in FIGS. 4A and 4B.
Figure 8:
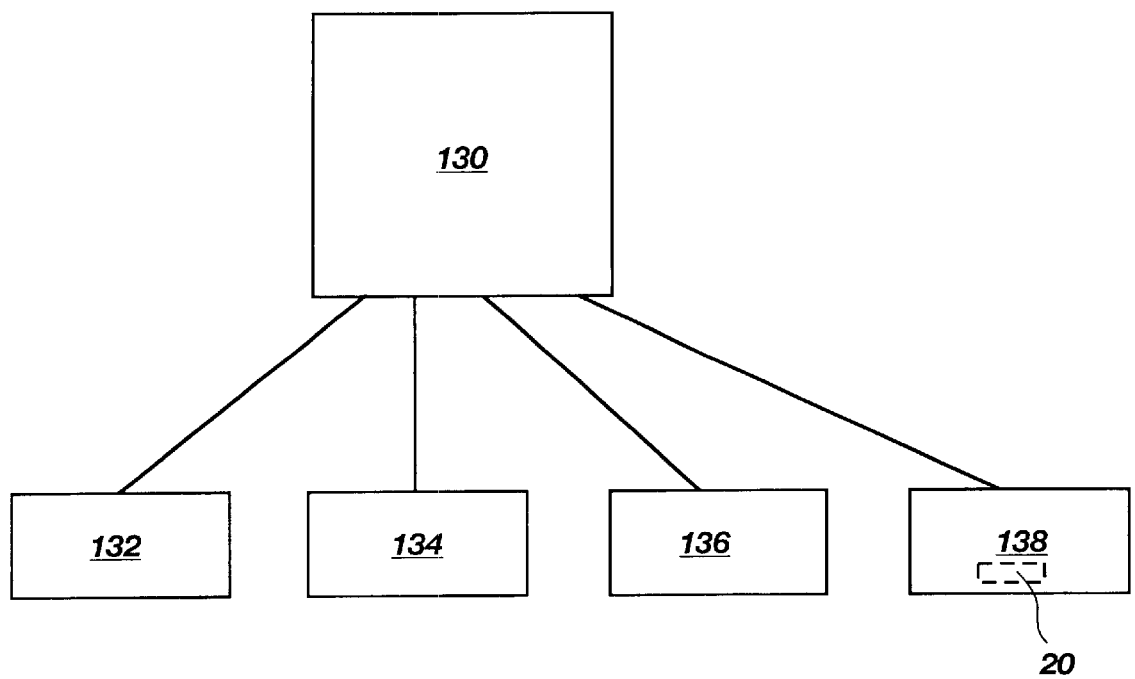
FIG. 8 is a block diagram of an electronic system incorporating the semiconductor device of FIGS. 4A and 4B.

As shown in FIG. 7, a semiconductor wafer 620 incorporates a plurality of integrated circuit dice 22 (shown in increased scale and reduced numbers relative to the wafer 620) of FIGS. 4A and 4B. Also, as shown in FIG. 8, an electronic system 130 includes an input device 132 and an output device 134 coupled to a processor device 136 which, in turn, is coupled to a memory device 138 incorporating the exemplary integrated circuit die 22 of FIGS. 4A and 4B.

Accordingly, the claims appended hereto are written to encompass all semiconductor devices including those mentioned. Those skilled in the art will also appreciate that various combinations and obvious modifications of the preferred embodiments may be made without departing from the spirit of this invention and the scope of the accompanying claims.

What is claimed is:

1. A computer system comprising:
   an input device;
   an output device;
   a processor coupled to said input and output devices; and
   a semiconductor device coupled to said processor, said semiconductor device further comprising:
   a die having an active surface having integrated circuitry and including a plurality of bond pads thereon connected to said integrated circuitry; and
   at least one electrically conductive wire bond between a first and a second bond pad of said plurality of bond pads used as an external electrical connection between said first and said second bond pads, said first and said second bond pads electrically interconnected via said integrated circuitry having a voltage drop therebetween, said at least one wire bond bypassing said voltage drop.

2. The computer system according to claim 1 wherein said first and second bond pads are not interconnected via said integrated circuitry within said die.

3. The computer system according to claim 1 wherein said first bond pad is a lead finger on said active surface and said second bond pad is an option bond pad electrically connected to a third bond pad selected from said plurality of bond pads on said active surface via said integrated circuitry.

4. The computer system according to claim 3 wherein said third bond pad connects to a fourth bond pad selected from said plurality of bond pads via a wire bond.

5. The computer system according to claim 4 wherein said first bond pad is an internal voltage line and said second bond pad is an external voltage line.

6. The computer system according to claim 1 wherein said first bond pad is connected to a first internal bus line and said second bond pad is connected to a second internal bus line.

7. A computer system comprising:
   an input device;
   an output device;
   a processor coupled to said input and output devices; and
   a semiconductor device coupled to said processor, said semiconductor device comprising:
   a die having integrated circuitry and having an active surface including a plurality of bond pads thereon connected to said integrated circuitry, a first and a second bond pad electrically interconnected via said integrated circuitry and having a voltage drop therebetween; and
   at least one electrically conductive wire bond between said first and said second bond pad of said plurality of bond pads used as an external electrical connection between said first and second bond pads, said a least one wire bond bypassing said voltage drop.

8. The computer system according to claim 7, wherein said first and second bond pads are not interconnected via said integrated circuitry within said die.

9. The computer system according to claim 7, wherein said first bond pad connects to a lead finger having a portion thereof located over said active surface and said second bond pad comprises an option bond pad electrically connected to a third bond pad selected from said plurality of bond pads on said active surface via said integrated circuitry.

10. The computer system according to claim 9, wherein said third bond pad connects to a fourth bond pad selected from said plurality of bond pads via a wire bond.

11. The computer system according to claim 10, wherein said first bond pad is an internal voltage line and said second bond pad is an external voltage line.

12. The computer system according to claim 8, wherein said first bond pad connects to a first internal bus line and said second bond pad connects to a second internal bus line.

* * * * *

UNITED STATES PATENT AND TRADEMARK OFFICE
CERTIFICATE OF CORRECTION

PATENT NO. : 6,617,692 B2
DATED : September 9, 2003
INVENTOR(S) : Aaron Schoenfeld It is certified that error appears in the above-identified patent and that said Letters Patent is hereby corrected as shown below:

Title page,
Item [56], References Cited, U.S. PATENT DOCUMENTS, before "3/1995" delete "*"; before "10/1995" delete "*"; before "6/1998" delete "*"; before "11/1998" delete "*"

Column 2,
Line 57, change "masking step" to -- mask --

Column 3,
Line 4, change "bonding" to -- bond --
Line 60, change "FIG. 4" to -- FIGs. 4A and 4B --

Column 4,
Line 61, change "bond" (both occurrences) to -- option --
Line 63, change "bond" to -- option --

Column 6,
Line 42, change "pad" to -- pads --

Signed and Sealed this

Twenty-eighth Day of September, 2004

JON W. DUDAS
*Director of the United States Patent and Trademark Office*